United States Patent
Lee et al.

(10) Patent No.: US 7,220,679 B2
(45) Date of Patent: May 22, 2007

(54) METHOD FOR FORMING PATTERNS IN A SEMICONDUCTOR DEVICE

(75) Inventors: Sung-koo Lee, Seoul (KR); Jae-chang Jung, Seoul (KR); Young-sun Hwang, Icheon-shi (KR); Cheol-kyu Bok, Seoul (KR); Ki-soo Shin, Seongnam-shi (KR)

(73) Assignee: Hynix Semiconductor Inc., Guynggi-do (KR)

( * ) Notice: Subject to any disclaimer, the term of this patent is extended or adjusted under 35 U.S.C. 154(b) by 0 days.

(21) Appl. No.: 10/461,107

(22) Filed: Jun. 13, 2003

(65) Prior Publication Data

US 2004/0067655 A1    Apr. 8, 2004

(30) Foreign Application Priority Data

Oct. 8, 2002   (KR) .................. 10-2002-0061208

(51) Int. Cl.
*H01L 21/461* (2006.01)
*H01L 21/4763* (2006.01)

(52) U.S. Cl. ................. 438/736; 438/780; 438/669; 438/636

(58) Field of Classification Search ............. 438/736, 438/780, 669, 671, 636
See application file for complete search history.

(56) References Cited

U.S. PATENT DOCUMENTS 5,733,714 A * 3/1998 McCulloch et al. ........ 430/325
5,879,863 A * 3/1999 Azuma et al. ............... 430/322
6,080,678 A   6/2000 Yim
6,136,679 A  10/2000 Yu et al.
6,180,316 B1 * 1/2001 Kajita et al. ............. 430/270.1
6,245,493 B1 * 6/2001 Singh et al. ................ 430/327
6,451,510 B1  9/2002 Messick et al.
6,534,418 B1  3/2003 Plat et al.

* cited by examiner

*Primary Examiner*—Michael Trinh
(74) *Attorney, Agent, or Firm*—Marshall, Gerstein & Borun LLP

(57) ABSTRACT

A method for forming a pattern of a semiconductor device is disclosed which can increase the contact area between a photoresist and an anti-reflective film by performing an etching process on the anti-reflective film in a process of forming a photoresist pattern for a semiconductor device so as to form fine irregularities, thereby preventing collapse of a photoresist pattern. The disclosed method includes: (a) forming an organic anti-reflective film by coating an organic anti-reflective coating composition onto an upper portion of a layer to be etched, and performing a baking process thereto; (b) forming fine irregularities on the organic anti-reflective film by performing an etching process on the formed organic anti-reflective film; and (c) forming a photoresist pattern by coating a photoresist on the upper portion of the organic anti-reflective film, exposing the photoresist and then developing the same.

9 Claims, 1 Drawing Sheet

METHOD FOR FORMING PATTERNS IN A SEMICONDUCTOR DEVICE

BACKGROUND

1. Technical Field

A method for forming patterns in a semiconductor device is disclosed, and more particularly, a method for forming patterns in a semiconductor device is disclosed which can increase the contact area between the photoresist and the anti-reflective film by performing an etching process on the anti-reflective film during the process of forming a photoresist pattern so as to form fine irregularities, thereby preventing the collapse of a photoresist pattern.

2. Description of the Related Art

It is known from conventional microfine pattern-forming processes that diffracted light and reflective light emitted from the lower film result in standing waves generated by optical properties of the lower film layer. As a result, variation in the thickness of a photoresist film, reflective notching, and/or variations of the critical dimension (hereinafter referring to as "CD") of the photoresist pattern unavoidably occur.

Accordingly, a protecting layer for maintaining the reflection on the lower film layer between the lower film and the photoresist has been introduced. The protecting layer is fabricated from materials with excellent light-absorbing ability within wavelength ranges of exposure light sources, the protecting layer is typically referred to as an anti-reflective film.

Anti-reflective films may be generally classified into inorganic or organic-based anti-reflective film, dependent on the type of materials to be used. In recent years, the organic anti-reflective films have been widely used and so, several organic anti-reflective films have been developed.

Meanwhile, when the adhesion between the photoresist and the organic anti-reflective film is poor, the photoresist pattern formed on the upper portion of the anti-reflective film may collapse. To solve such a problem, two techniques are mainly used. First, in order to increase the adhesion between the photoresist and the anti-reflective film, the organic anti-reflective film is developed so it conforms to the specific photoresist used in the formation of a pattern. However, the development of the organic anti-reflective film is time consuming and therefore costly.

Secondly, a method for increasing the contact area between the photoresist pattern and the anti-reflective film may be employed to increase the adhesion between the photoresist and the anti-reflective film. However, once the CD of the pattern is determined, the contact area between the anti-reflective film and the photoresist pattern is, for all practical purposes, fixed. Thus, conventionally, no method has been developed for effectively increasing the contact area between the anti-reflective film and the photoresist pattern.

Hence, in case of forming a photoresist pattern according to the conventional art, there still remains the phenomenon of the collapse of the pattern.

Due to such problems of the conventional art, there is an urgent need for a method for forming patterns of a semiconductor device which can prevent the collapse of the pattern by effectively increasing the contact area between the photoresist pattern and the anti-reflective film, and thus increasing adhesion between the pattern and the anti-reflective film.

SUMMARY OF THE DISCLOSURE

Methods for forming patterns of a semiconductor device are disclosed which can increase the contact area between a photoresist and an anti-reflective film by performing an etching process on the anti-reflective film in a process of forming a photoresist pattern so as to form fine irregularities, thereby preventing the collapse of a photoresist pattern.

One disclosed method comprises: (a) forming an organic anti-reflective film by coating an organic anti-reflective coating composition on an upper portion of a layer to be etched and performing a baking process thereto; (b) forming fine irregularities on the organic anti-reflective film by performing an etching process on the formed organic anti-reflective film; and (c) forming a photoresist pattern by coating a photoresist on the upper portion of the organic anti-reflective film, exposing the photoresist and then developing the same.

According to the disclosed method, the contact area between a photoresist and an anti-reflective film is increased by performing an etching process on the anti-reflective film formed on the upper portion of the layer to be etched so as to form fine irregularities, thereby preventing the collapse of a photoresist pattern caused by poor adhesion between the anti-reflective film and the photoresist and accordingly enabling the formation of a good photoresist pattern.

In the disclosed pattern-forming method, the baking process is preferably performed at a temperature ranging from about 150 to about 300° C. for a time period ranging from about 1 to about 5 minutes. By performing the baking process under these conditions, acid is generated from a thermal acid generator contained in the organic anti-reflective film and thus a cross-linking bond is formed in the anti-reflective film. Accordingly, an anti-reflective film which does not dissolve in the solvent of the photoresist is formed.

Additionally, in the disclosed pattern forming method, an additional baking process may be performed before and/or after the exposing process in the pattern forming step. This baking process is preferably performed at a temperature ranging from about 70 to about 200° C.

Furthermore, while the disclosed pattern-forming method is applicable to a microfine pattern-forming process using an ArF light source, it is applicable to a microfine pattern forming process using KrF, deep-ultraviolet ray (DUV) including EUV, E-beam, X-ray or ion beam.

A semiconductor device manufactured by the disclosed pattern-forming method is also disclosed.

BRIEF DESCRIPTION OF THE DRAWINGS

The above features and advantages of the disclosed methods will become more apparent from the following detailed description when taken in conjunction with the accompanying drawings wherein.

DETAILED DESCRIPTION OF THE PRESENTLY PREFERRED EMBODIMENT

A preferred embodiment will now be described with reference to the accompanying drawings. The following example and comparative example are presented for purposes of illustration and should not be construed to limit the scope of this disclosure.

COMPARATIVE EXAMPLE

Preparation of photoresist pattern according to the conventional art.

Figure 1:
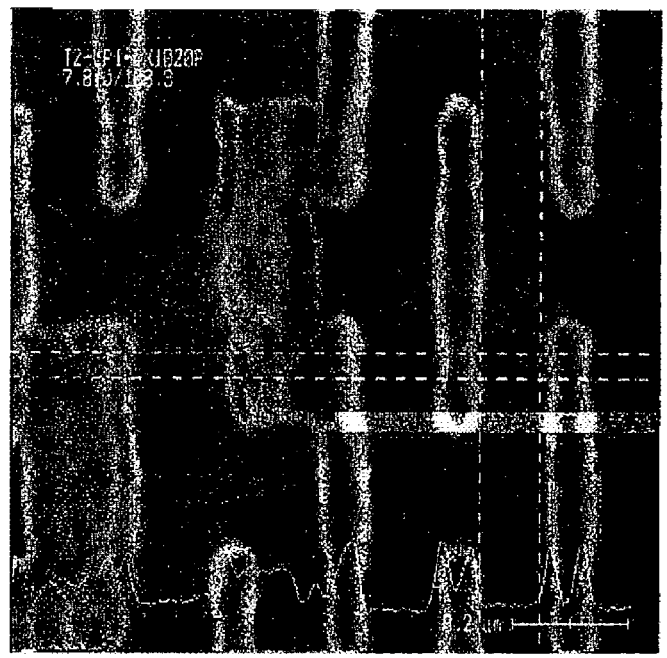
FIG. 1 is an electron micrograph showing a pattern collapse occurring when a pattern is formed according to the conventional art.

DARC-A20 (a product of Dongjin Semichem Co., Ltd., for use 1355 Å coating), which is an organic anti-reflective coating composition for ArF, was spin-coated on a silicon wafer. Then, it baked at 340° C. for 90 seconds and was cross-linked to form an organic anti-reflective film with a thickness for 350 Å. Then, AX1020P (the name of a commonly used photoresist material) photoresist of Clariant Co., Ltd. was coated on the upper portion of the organic anti-reflective film and then was baked at 120° C. for 90 seconds. After performing the baking process, the photoresist was exposed using an ArF exposure apparatus of ASML company and was baked again at 120° C. for 90 seconds. The exposed wafer was developed with 2.38% by weight of tetramethylammonium hydroxide (TMAH) developing solution to thus obtain a photoresist pattern as shown in FIG. 1.

EXAMPLE

Preparation of photoresist pattern according to the disclosed method.

Like the Comparative Example, DARC-A20 (a product of Dongjin Semichem Co., Ltd. for use in 355 Å coating), which is an organic anti-reflective coating composition for ArF, was spin-coated on a silicon wafer. Then, it was baked at 240° C. for 90 seconds and was cross-linked to form an organic anti-reflective film with a thickness of 1350 Å. Then, an etching process was performed on the organic anti-reflective film using an e-MAX etching apparatus (manufactured by Applied Materials (AMAT) Company). The etching process was performed under the conditions of 50mT/300W/150Ar/80CF4/2002/20CO/20. By such an etching process, the anti-reflective film remains with the same thickness of 350 Å A as the Comparative Example.

Then, AX1020P (the name of a commonly used photoresist material) photoresist of Clariant Co., Ltd. was coated on the upper portion of the organic anti-reflective film and then was baked at 120° C. for 90 seconds. After performing the baking process, the photoresist was exposed using an ArF exposure apparatus of ASML company and was baked again at 120° C. for 90 seconds. The exposed wafer was developed with 2.38% by weight of tetramethylammonium hydroxide (TMAH) developing solution to thus obtain a photoresist pattern as shown in FIG. 2.

Figure 2:
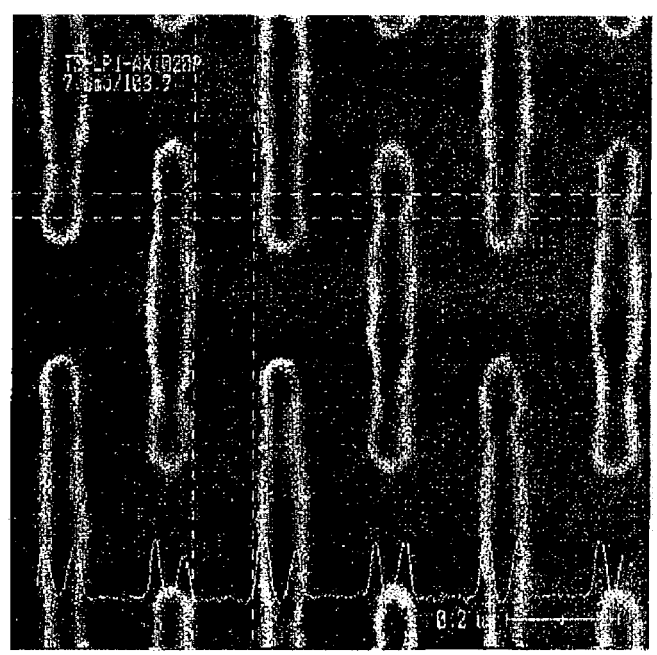
FIG. 2 is an electron micrograph showing a pattern profile when a pattern is formed according to a disclosed method.

As shown in Comparative Example and Example and FIGS. 1 and 2, in a case where an anti-reflective film and a photoresist pattern are formed according to the conventional pattern formation method, there occurs a problem, in that the photoresist pattern formed by this method collapses because the adhesion between the photoresist and the anti-reflective film are poor. On the other hand, in case a photoresist is formed after performing the etching process on the organic anti-reflective film, the contact area between the photoresist and the anti-reflective film is increased and thus a pattern collapse as shown in the conventional art is prevented, thereby forming a good photoresist pattern.

As described above, according to the disclosed method for forming patterns of a semiconductor device, the contact area between a photoresist and an anti-reflective film can be increased by performing an etching process on the anti-reflective film in the process of forming a photoresist pattern for a semiconductor device so as to form fine irregularities, thereby preventing the collapse of a photoresist pattern caused by poor adhesion between the anti-reflective film and the photoresist, and accordingly enabling formation of a quality photoresist pattern.

What is claimed is:

1. A method for forming a pattern in a semiconductor device, the method comprising:
    (a) forming an organic anti-reflective film by coating an organic anti-reflective coating composition on an upper portion of a layer to be etched and performing a baking process thereto;
    (b) forming irregularities on an upper surface of the organic anti-reflective film by performing an etching process on the formed organic anti-reflective film to increase a surface area of the upper portion of formed organic anti-reflective film; and
    (c) forming a photoresist pattern by coating a photoresist on the increased surface area of upper surface of the organic anti-reflective film, exposing the photoresist and then developing the same.

2. The method of claim 1, comprising performing the baking process at a temperature ranging from about 150° C. to about 300° C. for a time period ranging from about 1 to about 5 minutes.

3. The method of claim 1, wherein the pattern forming step further comprises an additional baking process before and/or after the exposure process.

4. The method of claim 3, comprising performing the additional baking process a temperature ranging from about 70° C. to about 200° C.

5. The method of claim 1, comprising performing the etching process with a dielectric etching tool.

6. The method of claim 2, comprising performing the etching process with a dielectric etching tool.

7. The method of claim 6, wherein the pattern forming step further comprises an additional baking process before and/or after the exposure process.

8. The method of claim 7, comprising performing the additional baking process a temperature ranging from about 70° C. to about 200° C.

9. The method of claim 2, comprising performing the baking process at a temperature of 240° C.

* * * * *